US008963746B2

(12) United States Patent
Chu

(10) Patent No.: US 8,963,746 B2
(45) Date of Patent: Feb. 24, 2015

(54) PHOTOELECTRIC TOUCH-SENSITIVE LINEAR ADJUSTMENT SWITCH FOR AN ELECTRIC APPLIANCE

(71) Applicant: Ching-Hsiung Chu, New Taipei (TW)

(72) Inventor: Ching-Hsiung Chu, New Taipei (TW)

( * ) Notice: Subject to any disclaimer, the term of this patent is extended or adjusted under 35 U.S.C. 154(b) by 229 days.

(21) Appl. No.: 13/674,113

(22) Filed: Nov. 12, 2012

(65) Prior Publication Data

US 2014/0111359 A1  Apr. 24, 2014

(51) Int. Cl.
*G08B 21/00* (2006.01)
*H03K 17/96* (2006.01)
*H01H 36/00* (2006.01)

(52) U.S. Cl.
CPC ........... *H03K 17/9631* (2013.01); *H01H 36/00* (2013.01)
USPC ................................. 341/31; 341/20; 250/221

(58) Field of Classification Search
USPC ....................... 341/20, 31; 340/644; 250/221; 200/61.02, 237
See application file for complete search history.

(56) References Cited

U.S. PATENT DOCUMENTS 4,800,264 A * 1/1989 Vissiere .................. 250/221

* cited by examiner

*Primary Examiner* — Jeffery Hofsass

(57) ABSTRACT

A touch-sensitive linear adjustment switch is configured to be touched along a linear direction in order to turn on or off, or make stepwise adjustment to the power supplied from, an external power source. The switch includes a housing having a light-permeable sensing surface. The touch control circuit board in the housing has a touch control circuit layer adjacent to the sensing surface. The surface of the touch control circuit layer is divided into plural first sensing areas arranged along the linear direction and is provided at intervals with plural first light-emitting elements, each located beside or in one first sensing area. When touched, the sensing surface triggers the touch control circuit layer in the corresponding first sensing area to control light emission of the light-emitting element(s) beside or in the first sensing area and to output a coded signal for controlling power supply from the external power source.

9 Claims, 5 Drawing Sheets

PHOTOELECTRIC TOUCH-SENSITIVE LINEAR ADJUSTMENT SWITCH FOR AN ELECTRIC APPLIANCE

BACKGROUND OF THE INVENTION

1. Technical Field

The present invention provides a touch-sensitive linear adjustment switch. More particularly, the present invention relates to a switch designed to be touched along a linear direction in order to turn on or off an external power source or make stepwise adjustment to the magnitude of the power supplied from the external power source.

2. Description of Related Art

A consumer electronic product, be it a computer, a communication device, or an electric home appliance, is often equipped with rotary knobs or switches for making adjustments. Such adjustment switches are analog control elements and generally are used to switch on or off the power supply to a circuit and adjust the magnitude of the power supplied, thereby adjusting the operation speed or output power of an electric appliance, such as the rotation speed of an electric fan, the coolness of an air conditioner, the acoustic volume of a loudspeaker, the brightness of an electric lamp, the signal strength of a radio, and so forth.

As is well known, a conventional adjustment switch is typically composed of mechanical structures which include a switch housing, a spindle pivotally connected to the switch housing and configured to be turned by the user, and a knob provided at the top of the spindle to facilitate turning by the user. Generally, such an adjustment switch is electrically connected to the circuit of an electric appliance, and the resistance of the switch can be controlled by the spindle for current and voltage adjustment. Thus, the magnitude of the power supplied from an external power source to the circuit can be controlled to thereby control the operation speed and output power of the electric appliance.

However, the mechanical components the conventional mechanical adjustment switch described above tend to get loose, malfunction, or become damaged after long-term and frequent use, not to mention that a deposition of dust or a buildup of grime on the mechanical components may, if not shortening the service life of the switch, compromise the ability of the switch to adjust and control a power source.

BRIEF SUMMARY OF THE INVENTION

The primary object of the present invention is to provide a switch which, when touched along a linear direction, can turn on or off, or adjust stepwise the magnitude of the power supplied from, an external power source. The present invention is intended to overcome the problem that the internal components of a conventional mechanical adjustment switch tend to get loose, malfunction, or become damaged after long-term and frequent use. The present invention is also intended to prevent the deposition or buildup of dust or grime which is likely to hinder the normal operation, compromise the convenience of use, or even shorten the service life, of an adjustment switch.

To achieve the above object, the touch-sensitive linear adjustment switch of the present invention includes:

a housing forming a receiving groove therein, wherein the housing has an outer wall serving as a light-permeable sensing surface to be touched by a human hand;

a touch control circuit board provided in the receiving groove and having a touch control circuit layer adjacent to the sensing surface, wherein the touch control circuit layer has a surface divided into a plurality of linearly arranged first sensing areas; and a plurality of first light-emitting elements provided at intervals on the surface of the touch control circuit layer, wherein each first light-emitting element is located beside or in one first sensing area, and the touch control circuit layer in each first sensing area is electrically connected to the first light-emitting element(s) therebeside or therein;

wherein when the sensing surface is touched at a portion corresponding to one of the first sensing areas, the touch control circuit layer in the first sensing area is triggered not only to control light emission of the first light-emitting element(s) beside or in the first sensing area, but also to output, according to the position of the first sensing area triggered, a coded signal for controlling power supply from an external power source.

According to the above, when the sensing surface is touched along the direction in which it extends, the touch control circuit layer in the sensing areas corresponding to the touched portion of the sensing surface generates the corresponding coded signal, which is output to an external circuit to control the magnitude of the power supplied to the external circuit from a power source. This enables the user to adjust the power supplied from the power source to the external circuit by a touch along a linear direction of the sensing surface. In addition, the first light-emitting elements beside or in the sensing areas corresponding to the touched portion of the sensing surface can emit light or stop emitting light in response to the touch, thus notifying the user of the current use state of the adjustment switch.

Thus, the object of turning on or off, or making stepwise adjustment to the magnitude of the power supplied from, an external power source by a touch along a linear direction can be achieved. The touch control circuit board enables touch-based adjustment of the power supplied from the power source of an external circuit, making it possible to dispense with the conventional mechanical switches designed for power supply adjustment, thereby preventing the problems associated with the conventional mechanical components, such as easy wear and tear and high chances of getting stuck. Consequently, the adjustment switch disclosed herein is expected to have a much longer service life than its mechanical counterparts. Moreover, the foregoing touch-based operation for adjusting the power supplied from a power source to an external circuit is rather simple, easy to perform, and truly practical.

A further description of how to implement the present invention is given below:

In addition to the major structural features described above, the housing includes a strip-shaped upper cover and a strip-shaped lower cover. The sensing surface is an outer wall of the strip-shaped upper cover. The touch control circuit board is provided between the strip-shaped upper cover and the strip-shaped lower cover.

In addition to the major structural features described above, the touch control circuit board is provided at intervals with a plurality of first positioning holes for receiving the first light-emitting elements respectively.

In addition to the major structural features described above, the first light-emitting elements are provided at intervals on two lateral sides of the first sensing areas.

In addition to the major structural features described above, the coded signal is in a pulse-width modulation format. Therefore, by outputting a digital pulse-width modulation signal as the coded signal, the power source of an external circuit can be turned on or off or otherwise controlled with higher precision than achievable by the conventional mechanical adjustment switches.

In addition to the major structural features described above, the sensing surface is made of a light-permeable material, and the surface of the touch control circuit layer is divided in such a way that it further has a second sensing area away from the first sensing areas. The second sensing area is provided therein with a second light-emitting element. The touch control circuit layer in the second sensing area is electrically connected to the second light-emitting element. When the sensing surface is touched at a position corresponding to the second sensing area, the touch control circuit layer in the second sensing area is triggered to change the light color of the second light-emitting element in the triggered second sensing area, thereby notifying the user of the current use state of the adjustment switch. The touch control circuit layer in the triggered second sensing area also causes the touch control circuit board to start or stop receiving external power supply.

In addition to the major structural features described above, the touch control circuit board is provided with a second positioning hole for receiving the second light-emitting element.

In addition to the major structural features described above, the receiving groove is provided therein with a supporting element pressing against the touch control circuit board to hold the touch control circuit board adjacent to the sensing surface.

In addition to the major structural features described above, the receiving groove is provided therein with a vibration motor electrically connected to the touch control circuit board. The vibration motor can be driven by the coded signal to provide a further notification to the user of the current use state of the adjustment switch.

BRIEF DESCRIPTION OF THE SEVERAL VIEWS OF THE DRAWINGS

The structure as well as a preferred mode of use, further objects, and advantages of the present invention will be best understood by referring to the following detailed description of some illustrative embodiments in conjunction with the accompanying drawings, in which.

DETAILED DESCRIPTION OF THE INVENTION

Figure 1:
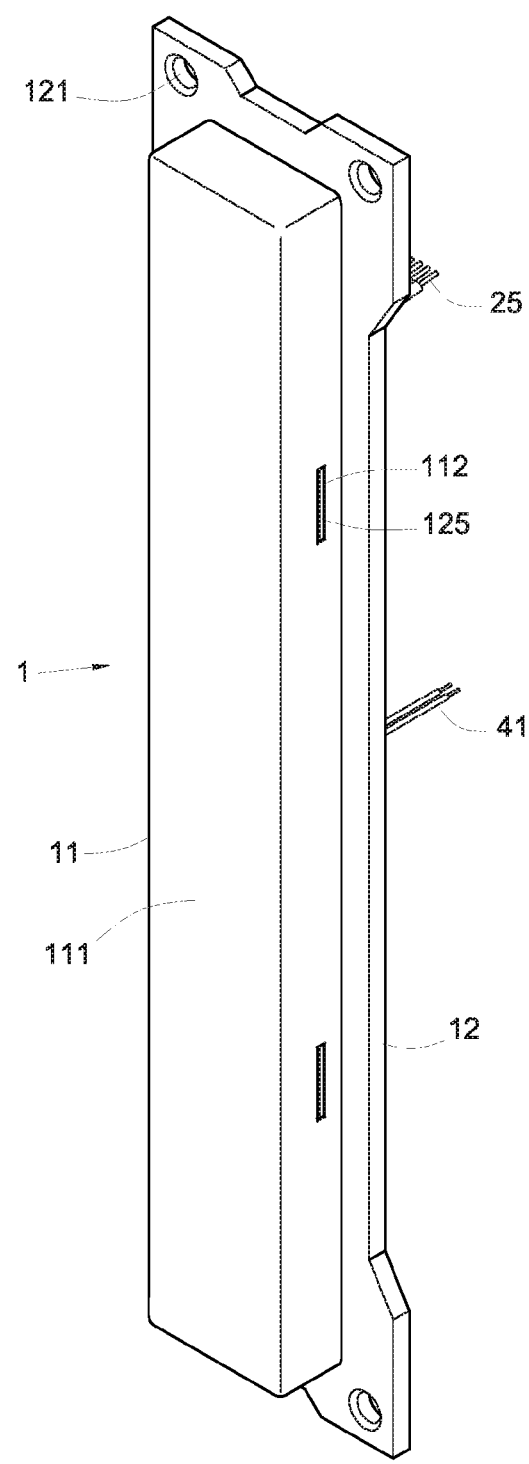
FIG. 1 is a perspective view of a preferred embodiment of the present invention.
Figure 2:
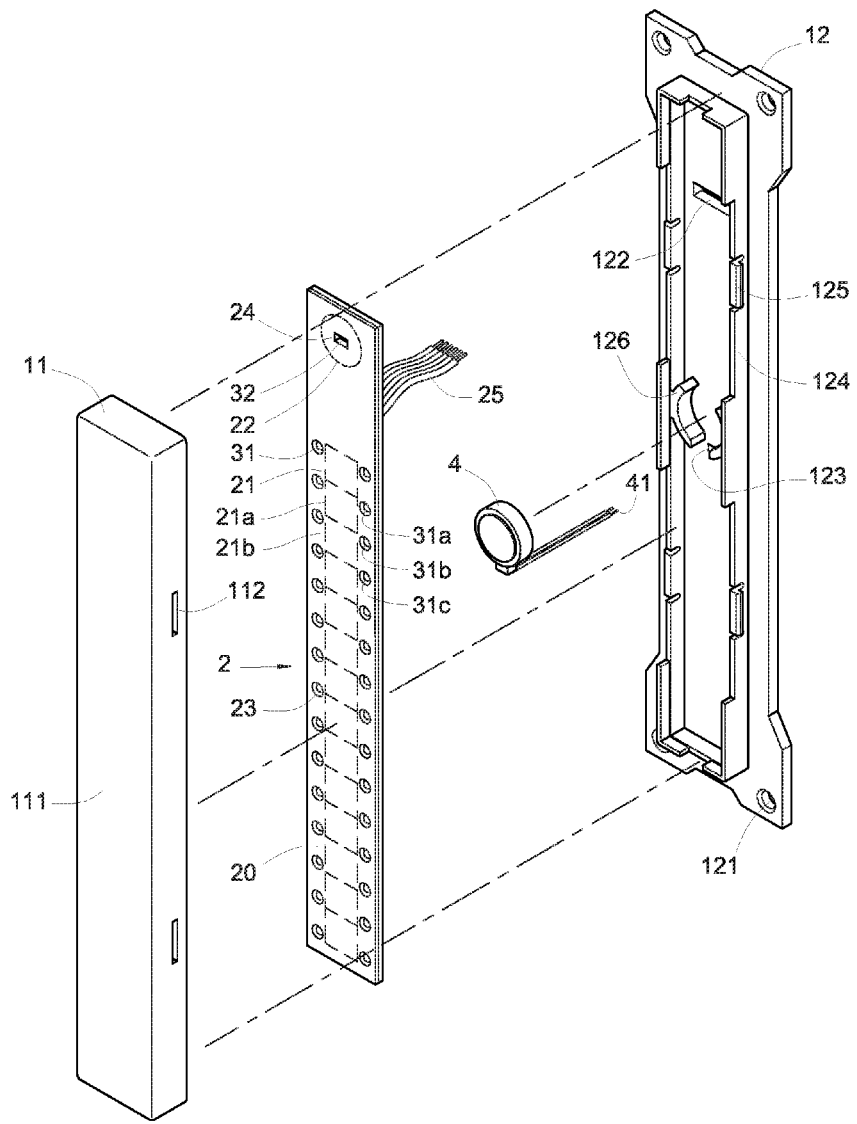
FIG. 2 is an exploded perspective view of the embodiment shown in FIG. 1.
Figure 3:
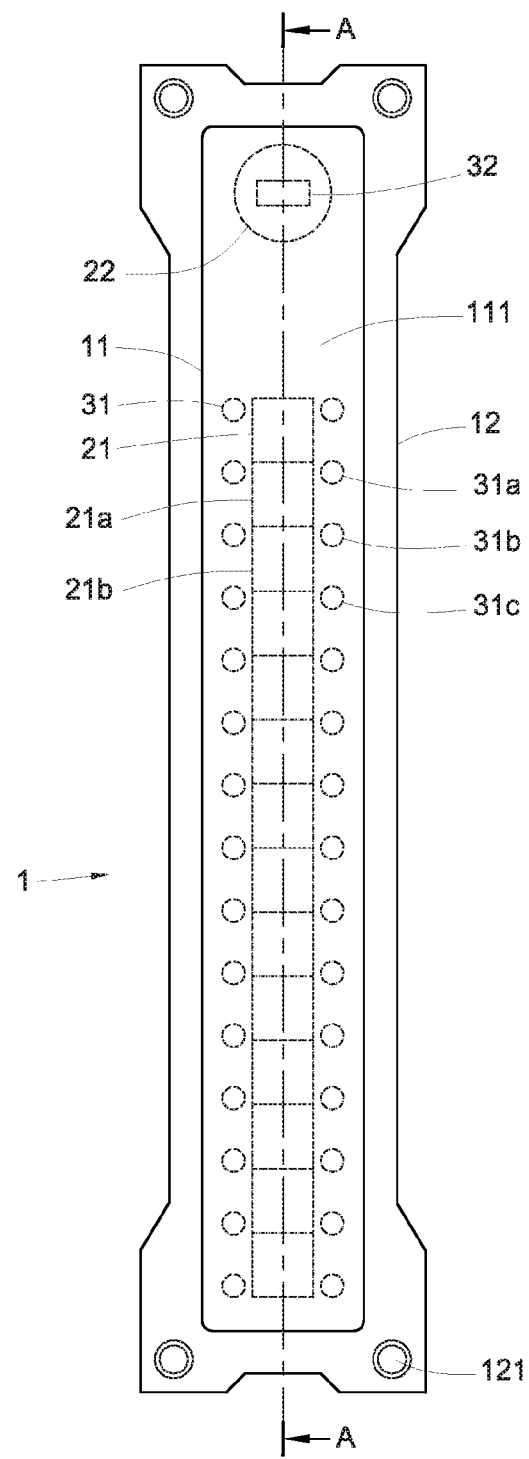
FIG. 3 is a front view of the embodiment shown in FIG. 1.

FIG. 1 is a perspective view of a preferred embodiment of the present invention. FIG. 2 is an exploded perspective view of the embodiment shown in FIG. 1. FIG. 3 is a front view of the embodiment shown in FIG. 1.

Figure 4:
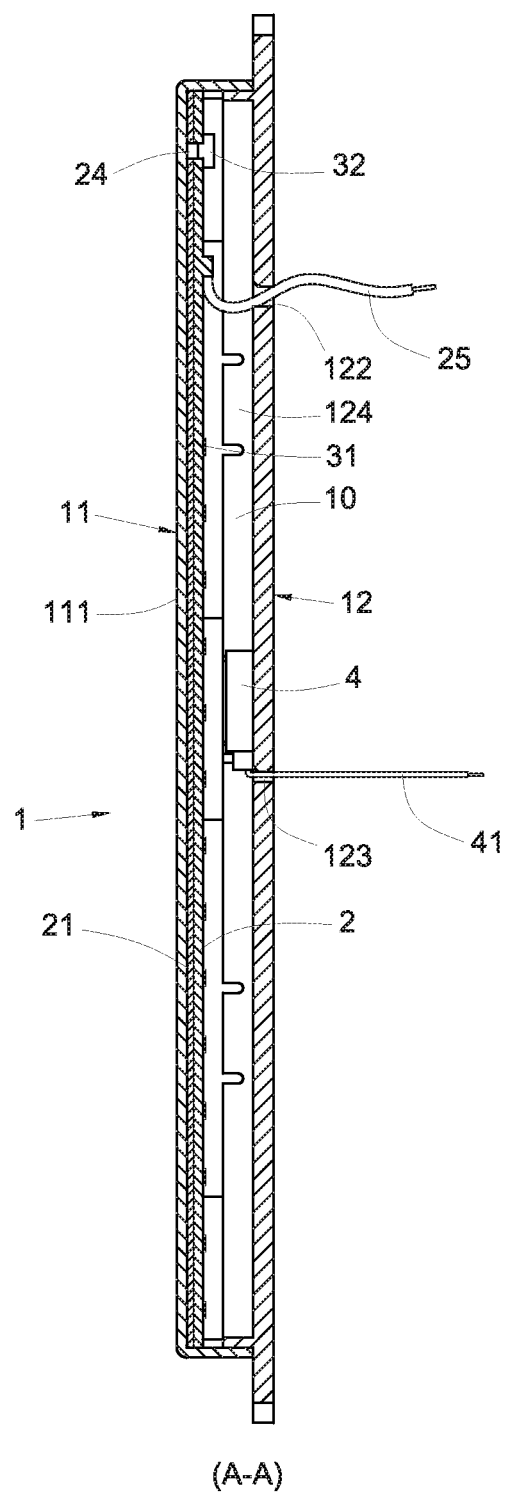
FIG. 4 is a sectional view taken along line A-A of FIG. 3.
Figure 5:
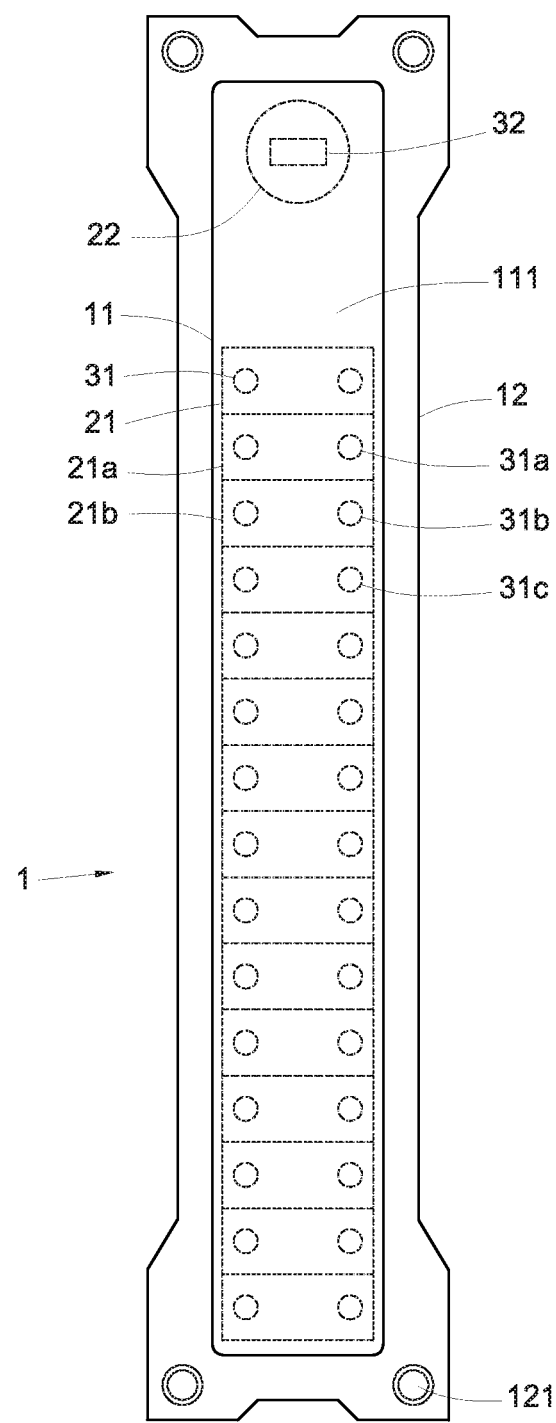
FIG. 5 is a front view similar to FIG. 3, showing another mode of implementation.

FIG. 4 is a sectional view taken along line A-A of FIG. 3. FIG. 5 is a front view similar to FIG. 3, showing another mode of implementation. Referring to FIG. 1 to FIG. 5, a touch-sensitive linear adjustment switch according to the present invention includes a housing 1, a touch control circuit board 2, and a plurality of first light-emitting elements 31.

The housing 1 has an elongated configuration and forms a receiving groove 10 therein. The housing 1 has an outer wall serving as a light-permeable sensing surface 111 to be touched by a human hand.

The housing 1 includes a strip-shaped upper cover 11 and a strip-shaped lower cover 12. The sensing surface 111 is an outer wall of the strip-shaped upper cover 11.

The strip-shaped lower cover 12 is peripherally provided with a plurality of screw holes 121. By means of the screw holes 121 of the strip-shaped lower cover 12, the housing 1 can be fixed to an external consumer electronic product, communication device, electric home appliance, or the like, or be positioned on an indoor or outdoor wall in order to control an electric appliance such as an indoor or outdoor lamp or an electric fan.

The touch control circuit board 2 is provided in the receiving groove 10 and between the strip-shaped upper cover 11 and the strip-shaped lower cover 12. The touch control circuit board 2 has a touch control circuit layer 20 adjacent to the sensing surface 111. The surface of the touch control circuit layer 20 is divided into a plurality of first sensing areas 21 which are arranged along a linear direction. More specifically, the first sensing areas 21 are linearly arranged along the direction in which the sensing surface 111 extends.

The touch control circuit board 2 has a plurality of signal lines 25 for connecting to the circuit of an external electric appliance. The inner wall of the strip-shaped lower cover 12 is provided with a first through hole 122 through which the signal lines 25 can extend outward.

The first light-emitting elements 31, which may be light-emitting diodes (LEDs), are provided on the surface of the touch control circuit layer 20 at intervals. Each first light-emitting element 31 is located beside or in one first sensing area 21. The touch control circuit layer 20 in each first sensing area 21 is electrically connected to the first light-emitting element(s) 31 beside or in the first sensing area 21.

When the sensing surface 111 is touched at a position corresponding to one of the first sensing areas 21, the touch control circuit layer 20 in that particular first sensing area 21 is triggered to control light emission of the first light-emitting element (s) 31 beside or in the triggered first sensing area 21. Also, according to the position of the triggered first sensing area 21, the touch control circuit layer 20 in the triggered first sensing area 21 outputs a coded signal for controlling the power supplied from a power source to the circuit of an external electric appliance.

The coded signal can turn on the aforesaid power source or/and gradually increase the power supplied from the power source to the external electric appliance. Alternatively, the coded signal can gradually decrease the power supplied from the power source to the external electric appliance or/and turn off the power source.

The present invention further includes the following technical features:

The touch control circuit board 2 is provided at intervals with a plurality of first positioning holes 23 for receiving the first light-emitting elements 31 respectively. The first light-emitting elements 31 are respectively positioned in the first positioning holes 23.

The first light-emitting elements 31 may be arranged at intervals in two rows which are respectively located on two lateral sides of the first sensing areas 21. Thus, even if one row of the first light-emitting elements 31 is blocked from view during operation, the light of the other row of the first light-emitting elements 31 is still visible.

The coded signal may be in a pulse-width modulation (PWM) format, wherein pulse-width modulation is a technique for converting an analog signal into a pulse. Generally speaking, a pulse generated from such conversion has a fixed period, but the duty cycle of the pulse depends on the magnitude of the source analog signal.

The sensing surface 111 may be made of a light-permeable material. The surface of the touch control circuit layer 20 may be divided in such a way that a second sensing area 22 away from the first sensing areas 21 is also defined. A second light-emitting element 32 is provided in the second sensing area 22. The touch control circuit layer 20 in the second sensing area 22 is electrically connected to the second light-emitting element 32.

The first sensing areas 21 may be so distributed that they correspond in position to an area of the sensing surface 111 that ranges from the middle to one end of the sensing surface 111. The second sensing area 22, on the other hand, may correspond in position to the opposite end of the sensing surface 111.

When the sensing surface 111 is touched at a position corresponding to the second sensing area 22, the touch control circuit layer 20 in the second sensing area 22 is triggered to control the change of light color of the second light-emitting element 32 in the triggered second sensing area 22, thereby notifying the user of the current use state of the adjustment switch. The touch control circuit layer 20 in the triggered second sensing area 22 also causes the touch control circuit board 2 to start or stop receiving external power supply.

The touch control circuit board 2 is provided with a second positioning hole 24 for receiving the second light-emitting element 32.

The strip-shaped lower cover 12 is peripherally provided with a supporting element 124. The supporting element 124 is located in the receiving groove 10 and presses against the touch control circuit board 2 to keep the touch control circuit board 2 adjacent to the sensing surface 111.

The two lateral sides of the supporting element 124 are each provided with two projecting fasteners 125, and the two lateral sides of the strip-shaped upper cover 11 are each provided with two fastening grooves 112 to be fastened with the corresponding fasteners 125 respectively, thereby fastening the strip-shaped upper cover 11 and the strip-shaped lower cover 12 together.

The receiving groove 10 is provided therein with a vibration motor 4 electrically connected to the touch control circuit board 2. The vibration motor 4 is to be driven by the coded signal and has power lines 41 for connecting to the circuit of an external electric appliance and the touch control circuit board 2. The inner wall of the strip-shaped lower cover 12 is provided with a second through hole 123 through which the power lines 41 can extend outward. The inner wall of the strip-shaped lower cover 12 is further provided with a positioning frame 126 for securing the vibration motor 4.

The present invention can be implemented with the components described above. The housing 1 may be provided on an indoor or outdoor wall accessible by a human hand, or the housing 1 may be provided on the surface of an electric appliance. The signal lines 25 of the touch control circuit board 2 serve to make electrical connection between an external power source and the circuit of an electric appliance.

In normal use, the second light-emitting element 32 in the second sensing area 22 emits light of a certain color through the sensing surface 111 when the touch control circuit board 2 electrically connects an external power source and the circuit of an electric appliance. If the first sensing areas 21 are touched in this state, no reactions will occur. The user is required to touch the top end of the sensing surface 111 first, thereby triggering the second sensing area 22, causing the touch control circuit board 2 to start receiving external power supply, and driving the second light-emitting element 32 to emit light of another color. Only then can the electric appliance be operated via the first sensing areas 21.

The edge of the sensing surface 111 may be provided with a starting mark indicating the first sensing area 21 to be touched first. In use, the sensing surface 111 may be touched along a downward or upward direction, starting from the starting mark, or the sensing surface 111 may be directly touched at a position corresponding to any of the first sensing areas 21.

In one embodiment, the sensing surface 111 can be touched linearly downward along its extending direction by a user's finger. For example, the user's touch begins with a first sensing area 21 and then slides downward through a second first sensing area 21$a$ and a third first sensing area 21$b$. When the user's finger stops at the third first sensing area 21$b$, the first light-emitting elements 31, 31$a$ corresponding respectively to the first and the second first sensing areas 21, 21$a$ that have just been touched continue to emit light. Meanwhile, the first light-emitting elements 31$c$ corresponding to the untouched portion of the sensing surface 111 do not emit light. Thus, the light emitted by the first light-emitting elements 31, 31$a$, 31$b$ forms two line segments (hereinafter referred to as the linear light) on the sensing surface 111.

At the same time, the touch control circuit layer 20 in the first sensing areas 21, 21$a$, 21$b$ corresponding to the touched portion of the sensing surface 111 generates the corresponding coded signal. The coded signal is output to the circuit of an external electric appliance via the signal lines 25 and thereby controls the magnitude of the power supplied from a power source to the circuit of the external electric appliance.

More particularly, the number of the first sensing areas 21, 21$a$, 21$b$, 21$c$ that are triggered by the touched portion of the sensing surface 111 determines the degree to which the adjustment switch of the present invention is turned on. In other words, the longer the linear light is, the more the adjustment switch is turned on, and the more power is supplied from the external power source. Conversely, the shorter the linear light is, the less the adjustment switch is turn on, and the less power is supplied from the external power source.

The turning off of the adjustment switch of the present invention may be so designed that the user's touch must not begin with an arbitrary first sensing area 21, 21$a$, 21$b$ but is required to start with the third sensing area 21$b$, i.e., the last-triggered first sensing area in the previous touch, and then move backward. Differently put, the portion of the sensing surface 111 that corresponds to the third first sensing area 21$b$ must be touched again, and the touch must thereafter glide upward through the second and the first sensing areas 21$a$, 21, in that order, until the first light-emitting elements 31$b$, 31$a$, 31$a$ corresponding respectively to the third, the second, and the first sensing areas 21$b$, 21$a$, 21 sequentially stop emitting light. In the meantime, the touch control circuit layer 20 generates the corresponding coded signal.

In another embodiment, if the portion of the sensing surface 111 that corresponds to the third first sensing area 21$b$ is touched directly after the portion of the sensing surface 111 that corresponds to the first first sensing area 21 is touched to drive the corresponding first light-emitting elements 31 to emit light, the first light-emitting elements 31 corresponding to the first sensing area 21 will go out as soon as the first light-emitting elements 31$b$ corresponding to the third first sensing area 21$b$ begin to emit light. That is to say, only the first light-emitting elements 31, 31$a$, 31$b$ corresponding to a single sensing area 21, 21$a$, 21$b$ can emit light at any given moment. In use, it is feasible to start touching the sensing surface 111 from a position corresponding to a first sensing area 21, 21*a*, 21*b* other than that indicated by the starting mark, and the intended effect of controlling the magnitude of the power supplied from a power source to the circuit of an external electric appliance is still achievable.

It should be pointed out that, now that the present invention is free of the conventional mechanical rotating components, the housing 1 may have a watertight configuration to effectively prevent liquid from seeping into the switch and further increase the durability of the switch. The watertight configuration also makes it possible to install the switch in a high-moisture environment or even in a liquid, allowing the adjustment switch of the present invention to be used in a wide variety of applications.

During the aforesaid operation, the vibration motor 4 is driven to vibrate by the coded signal. The vibration motor 4 can also vary the amplitude of vibrations according to the coded signal and thereby provide a further notification to the user of the current use state of the adjustment switch.

Thus, the aforesaid object of turning on or off, or making stepwise adjustment to the magnitude of the power supplied from, an external power source by a touch along a linear direction can be achieved. Thanks to the touch control circuit board 2, the power supply state of the power source of an external circuit can be adjusted by touching the sensing surface 111 along a linear direction, and in light of this, the conventional mechanical switches for power supply adjustment can be dispensed with. Now that the drawbacks of the conventional mechanical components (e.g., wear and tear and getting stuck) are eliminated, the service life of the adjustment switch of the present invention is expected to be much longer than those of the conventional mechanical switches. Moreover, in order to notify the user of the current use state of the adjustment switch, the first light-emitting elements 31, 31*a*, 31*b* respectively beside or in the first sensing areas 21, 21*a*, 21*b* corresponding to the touched portion of the sensing surface 111 can emit light or stop emitting light in response to the user's touch. In addition, by outputting a digital PWM signal as the coded signal, the power source of an external circuit can be turned on or off or otherwise controlled more precisely than a conventional mechanical adjustment switch would allow. Last but not least, the foregoing touch-based operation for adjusting the power supplied from a power source to an external circuit is rather simple, easy to perform, and truly practical.

What is claimed is:

1. A photoelectric touch-sensitive linear adjustment switch for an electric appliance, comprising:
    a housing forming a receiving groove therein, the housing having an outer wall serving as a light-permeable sensing surface to be touched by a human hand;
    a touch control circuit board provided in the receiving groove, the touch control circuit board having a touch control circuit layer adjacent to the sensing surface, the touch control circuit layer having a surface divided into a plurality of first sensing areas which are arranged along a linear direction; and
    a plurality of first light-emitting elements provided at intervals on the surface of the touch control circuit layer, each said first light-emitting element being located beside or in a said first sensing area, the touch control circuit layer in each said first sensing area being electrically connected to the first light-emitting element or the first light-emitting elements beside or in the each said first sensing area;
    wherein when the sensing surface is touched at a position corresponding to a said first sensing area, the touch control circuit layer in the first sensing area is triggered to control light emission of the first light-emitting element or the first light-emitting elements beside or in the triggered first sensing area and to output, according to a position of the triggered first sensing area, a coded signal for controlling a power supply from an external power source.

2. The photoelectric touch-sensitive linear adjustment switch for the electric appliance of claim 1, wherein the housing comprises a strip-shaped upper cover and a strip-shaped lower cover, the sensing surface being an outer wall of the strip-shaped upper cover, the touch control circuit board being provided between the strip-shaped upper cover and the strip-shaped lower cover.

3. The photoelectric touch-sensitive linear adjustment switch for the electric appliance of claim 1, wherein the touch control circuit board is provided at intervals with a plurality of first positioning holes for receiving the first light-emitting elements respectively.

4. The photoelectric touch-sensitive linear adjustment switch for the electric appliance of claim 1, wherein the first light-emitting elements are provided at intervals on two lateral sides of the first sensing areas.

5. The photoelectric touch-sensitive linear adjustment switch for the electric appliance of claim 1, wherein the coded signal is in a pulse-width modulation format.

6. The photoelectric touch-sensitive linear adjustment switch for the electric appliance of claim 1, wherein the sensing surface is made of a light-permeable material, and the surface of the touch control circuit layer is divided in such a way that a portion of the surface that is away from the first sensing areas is defined as a second sensing area, the second sensing area being provided therein with a second light-emitting element, the touch control circuit layer in the second sensing area being electrically connected to the second light-emitting element such that, when the sensing surface is touched at a position corresponding to the second sensing area, the touch control circuit layer in the second sensing area is triggered to control a change of color of light emitted by the second light-emitting element in the triggered second sensing area and to cause the touch control circuit board to start or stop receiving external power supply.

7. The photoelectric touch-sensitive linear adjustment switch for the electric appliance of claim 6, wherein the touch control circuit board is provided with a second positioning hole for receiving the second light-emitting element.

8. The photoelectric touch-sensitive linear adjustment switch for the electric appliance of claim 1, wherein the receiving groove is provided therein with a supporting element pressing against the touch control circuit board to keep the touch control circuit board adjacent to the sensing surfacey.

9. The photoelectric touch-sensitive linear adjustment switch for the electric appliance of claim 1, wherein the receiving groove is provided therein with a vibration motor, the vibration motor being electrically connected to the touch control circuit board so as to be driven by the coded signal.

* * * * *